United States Patent [19]

Iizuka

[11] 4,156,154
[45] May 22, 1979

[54] FLIP-FLOP CIRCUIT

[75] Inventor: Tetsuya Iizuka, Kawasaki, Japan

[73] Assignee: Tokyo Shibaura Electric Co., Ltd., Kawasaki, Japan

[21] Appl. No.: 858,829

[22] Filed: Dec. 8, 1977

[30] Foreign Application Priority Data

Dec. 14, 1976 [JP] Japan .................................. 51-149360
Dec. 14, 1976 [JP] Japan .................................. 51-149361

[51] Int. Cl.² ........................................... H03K 3/286
[52] U.S. Cl. .................................... 307/292; 307/215; 307/303; 357/92
[58] Field of Search ............... 307/215, 291, 292, 303; 357/92

[56] References Cited

U.S. PATENT DOCUMENTS

3,603,815  9/1971  Rao ................................... 307/292 X
3,930,266  12/1975  Okamoto ......................... 307/291 X

Primary Examiner—John Zazworsky
Attorney, Agent, or Firm—Flynn & Frishauf

[57] ABSTRACT

A flip-flop circuit includes first, second, third and fourth NAND gates each with first and second output terminals. The first output terminal of the first NAND gate C and the first output terminal of the third NAND gate are connected to the input terminals of the second and fourth NAND gates, respectively. The first output terminals of the second and fourth NAND gates are connected to the input terminals of the first and third NAND gates, respectively. The second output terminals of the first and second NAND gates are connected to the input terminals of the third and fourth NAND gates, respectively. The second output terminal of the fourth NAND gate is coupled with the input terminal of the first NAND gate. A first diode is inserted between the input terminals of the first and second NAND gates and second diode is inserted between the third and fourth NAND gates. An input signal is applied to the input terminal of the second NAND gate, and an output signal is taken from the second output terminal of the third NAND gate.

8 Claims, 18 Drawing Figures

FLIP-FLOP CIRCUIT

BACKGROUND OF THE INVENTION

The present invention relates to a flip-flop circuit and more particularly a flip-flop circuit including four logical gates and single input and output lines.

Figure 1:
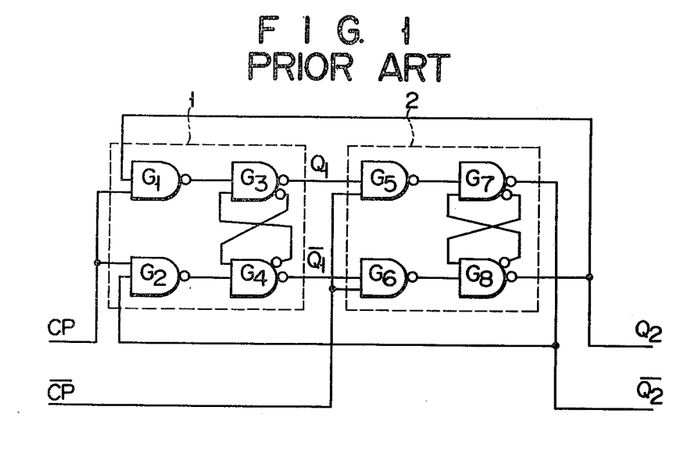
FIG. 1 shows a schematic circuit diagram of a conventional master-slave flip-flop circuit.

A master-slave type flip-flop circuit have been known for binary counters or frequency-dividing circuits. This type flip-flop is shown in FIG. 1, including a first R-S FF (flip-flop) 1 having gates $G_1$ to $G_4$ and a second R-S FF having gates $G_5$ to $G_8$. Clock pulses CP for control is applied to the first FF circuit 1 and clock pulses $\overline{CP}$ for control to the second FF circuit 2. Output signals $Q_2$ and $\overline{Q}_2$ are taken from the gates $G_8$ and $G_7$, respectively. When the clock pulses CP and $\overline{CP}$ are used as input signals, the CP is at high level against low level of the $\overline{CP}$ and at low level against high level of the $\overline{CP}$. In the first step, when the output $Q_2$ is at high level ($V_H$), input control gates $G_1$ and $G_2$ are enabled when the CP becomes high in level and the output $Q_1$ of the first FF circuit 1 becomes $V_H$. In the step 2, the CP becomes low ($V_L$) in level so that the control gates $G_1$ and $G_2$ are disabled. On the other hand, the $\overline{CP}$ becomes $V_H$ to enable the input control gates $G_5$ and $G_6$ of the FF circuit 2. Accordingly, the output of the FF circuit 2 is inversed and thus its output $Q_2$ becomes $V_L$. In the step 3, the $\overline{CP}$ becomes $V_L$ to disable the control gates $G_5$ and $G_6$. In this manner, the clock pulses CP and $\overline{CP}$ become alternately $V_H$ and $V_L$ and the state of $V_H$ is alternately switched between the flip-flop circuits 1 and 2. That is, the level of the output $Q_2$ becomes $V_H$ one time every two times of $V_H$ states of the CP.

The master-slave type flip-flop circuit needs eight gates and two input and output lines, as shown. This makes it difficult to fabricate a number of flip-flop circuits by using high density integrated circuits. It must be avoided, further, that both waveforms of the CP and $\overline{CP}$ are concurrently $V_H$ in any time period. This restricts the waveform of the clock pulse.

Accordingly, the primary object of the invention is to provide a flip-flop circuit in which the much the same function as of the FIG. 1 flip-flop may be attained by using four logical gates and single input and output lines.

SUMMARY OF THE INVENTION

A preferred embodiment of the invention includes first, second, third and fourth NAND gates each with first and second output terminals. The first output terminals of the first and third NAND gates are connected to the input terminals of the second and fourth NAND gates, respectively. The first output terminals of the second and fourth NAND gates are connected to the input terminals of the first and third NAND gates, respectively. The second output terminals of the first and second NAND gates are connected to the input terminals of the third and fourth NAND gates, respectively. The second output terminal of the fourth NAND gate is connected to the input terminal of the first NAND gate. A first diode is connected between the input terminals of the first and second NAND gates and a second diode between the input terminals of the third and fourth NAND gates. An input signal is fed to the input terminal of the second NAND gate. An output signal is taken from the second output terminal of the third NAND gate.

According to the present invention, the number of the logical gates may be reduced with half number of the input and output lines as compared with the FIG. 1 case. Therefore, when this is fabricated with integrated circuits, the integration density is improved together with the upper limit of the operation frequency. The reduction of number of the logical gates and wiring brings about power saving and high speed of the circuit operation.

The invention will be better understood from the following description taken in connection with the accompanying drawings, in which:

DETAILED DESCRIPTION OF THE PREFERRED EMBODIMENTS

Figure 3:
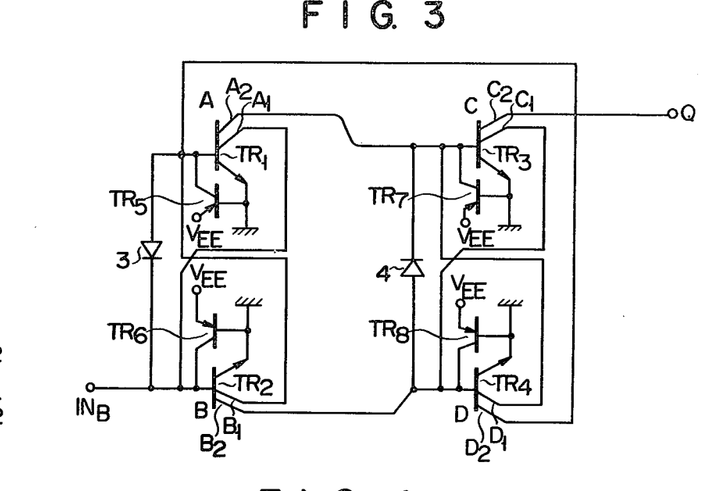
FIG. 3 is a first embodiment according to this invention showing a circuit diagram of the FIG. 1 circuit when it is fabricated by integrated injection logic (IIL)
Figure 4:
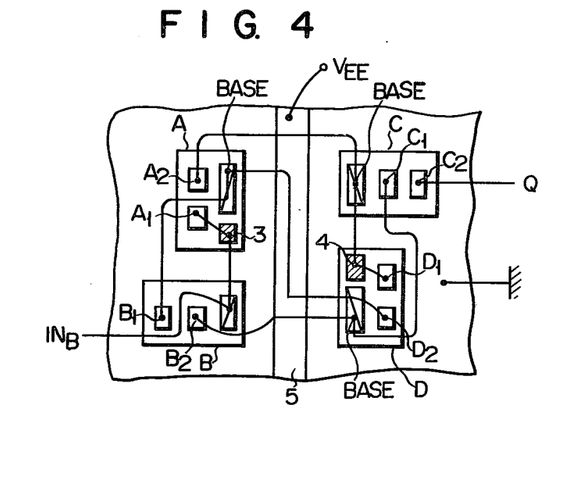
FIG. 4 shows a plan view of the circuit of FIG. 3 fabricated by an integrated circuit.

Referring now to FIG. 3, a flip-flop circuit is comprised of first, second, third and fourth NAND gates A, B, C and D. Each of these NAND gates is constructed as an IIL (integrated injection logic). Transistors of npn type $TR_1$, $TR_2$, $TR_3$ and $TR_4$ of the NAND gates A, B, C and D are provided with first and second output terminals ($A_1$, $A_2$), ($B_1$, $B_2$), ($C_1$, $C_2$) and ($D_1$, $D_2$). The emitters of these transistors are commonly grounded. The collector and base of each pnp injection transistors $TR_5$ to $TR_8$ are connected with the base and emitter of the corresponding npn transistor and the emitter thereof is connected to a injector source $V_{EE}$ jointly, as shown. The first output terminal $A_1$ of the gate A is connected to the base of the gate B. The first output terminal $B_1$ of the gate B is connected to the base of the gate A. The first terminal $C_1$ of the gate C is connected to the base of the gate D. The first output terminal $D_1$ of the gate D is connected to the base of the gate C. The bases of the gates A and B are coupled each other through a first diode 3 forwardly directed from the gate A to the gate B. The bases of the gates C and D are connected each other through a second diode 4 forwardly directed from the gate D to C. The second output terminal $D_2$ of the gate D is connected to the base of the gate A. An input signal $IN_B$ is fed to the base of the gate B. An output signal Q is taken out from the second output terminal $C_2$ of the gate C. In FIG. 4, to the respective regions in FIG. 4, like numerals in FIG. 3 are attached with omission of the explanation thereof. As seen from FIG. 4, the emitter region 5 commonly formed for the injector transistors $TR_5$ to $TR_8$ is of p-type and of stripe shape and connected to the injector source $V_{EE}$. The output regions (N region of the npn transistor) with the output terminals $B_1$ and $B_2$ of the gate B formed therein and the output regions (N) with output terminals $C_1$ and $C_2$ of the gate C, are arranged normal to the stripe 5. The output regions (N) where the output terminals $A_1$ and $A_2$ of the gate A and the output terminals $D_1$ and $D_2$ of the gate D are formed, are arranged in parallel with the stripe 5. With this arrangement, current fed from the pnp injector transistor to the npn transistor of the gate A is larger than that of the gate B. Further, the current of the gate D is larger than that of the gate C. For this reason, the input current fed to the gate A rises earlier than that to the gate B. Similarly, the current fed to the gate D rises earlier than that to the gate C.

The circuit operation of FIG. 3 will be given with reference to FIGS. 5 and 6. Assume now that an input signal CP (clock pulses) to the third gate at the preceding stage FF (see FIG. 6) is $V_L$ (low level) at the first stage. At this time, the logical values at the input terminals of the gates A and B are $V_H$ (high level) and $V_L$ (low level) or $V_L$ and $V_H$; however, it is assumed now that they are $V_H$ and $V_L$. Under this assumption, the voltage levels at the input terminals of the gates C and D are $V_L$ and $V_L$. More strictly, the voltage level at the input terminal of the gate D is higher than that at the input terminal of the gate C by the forward voltage drop of the diode 4. Irrespective of this fact, the voltage level at the input terminal of the gate D is treated as the logical level $V_L$. For the diodes 3 and 4, Shottky diodes are preferable but ordinary pn junction type diodes may also be used. In this case, the concentration of the p and n regions desirably is in the order of $10^{17}$ atoms/cm$^3$. In the first step, the output Q of the gate C is at level of $V_H$. In the second step, assume that the level of the input signal CP is changed from $V_L$ to $V_H$. In response to the change, the voltages at the input terminals of the gates A and B become both $V_L$. The voltage at the input terminal of gate A exhibits the level of $V_F$; however, the logical level is at $V_L$. Then, the output terminals $A_1$ and $A_2$ of the gate A and the output terminals $B_1$ and $B_2$ of the gate B exhibit high impedance against the earth. As a result, one of the input terminal voltages of each gate C and D is at $V_H$ and the other terminal is at $V_L$. In this case, the input terminal voltage of the gate D is higher than that of the gate C by the forward voltage drop $V_F$ of the diode 4, and the injector current to the gate D is larger than that to the gate C, as stated referring to FIG. 3. These facts cause the input terminal voltage of the gate D to be $V_H$ and the input terminal voltage of the gate C to be $V_L$. Therefore, the output Q is kept at $V_H$.

In the step 3, the CP becomes $V_L$ again. On the other hand, the output terminals $D_1$ and $D_2$ of the gate D are at $V_L$ so that the input terminal voltage of the gate A is kept at $V_L$ and the input terminal voltage of the gate B is at $V_H$. Accordingly, the output terminals $B_1$ and $B_2$ of the gate B are at $V_L$ and the input terminal of the gate D is at $V_L$ and the input terminal voltage of the gate C is at $V_H$. As a result, the output Q is $V_L$. In step 4, the input signal CP becomes $V_H$ in level again. At this time, the input terminal voltages of the gates A and B become both $V_L$. The input terminal voltage of the gate A has the forward voltage drop level $V_F$ of the diode 3 but its logical level is $V_L$. However, the input terminal voltages of the gates C and D maintain the state of the step 3. Similarly, the input terminal voltage of the gate D has the forward voltage drop level $V_F$ of the diode 4 but its logical level is $V_L$. Since the input terminal voltage of the gate C is at $V_H$, the output Q level maintains its step 3 level of $V_L$. In step 5, the input signal CP becomes $V_L$ again. Then, the output terminals $D_1$ and $D_2$ of the gate D are at $V_H$ so that the input terminal voltage of the gate A becomes $V_H$ and the input terminal voltage of the gate B becomes $V_H$. Accordingly, the output Q becomes $V_H$ level. As seen from the foregoing description, the output terminals $C_1$ and $C_2$ voltages of the gate, C, i.e. the output Q, becomes $V_H$ one time every the input signal CP becomes $V_L$ two times (step 1 and step 3).

Figure 7:
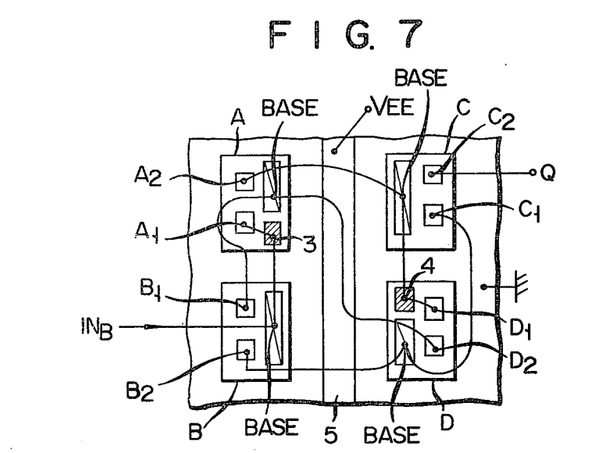
FIG. 7 is a modification of the structure of FIG. 4.

The output terminals ($B_1$, $B_2$) and ($C_1$, $C_2$) of the gates B and C are not necessarily disposed normal to the stripe 5 but it may be in parallel with the stripe 5, as shown in FIG. 7.

Figure 2:
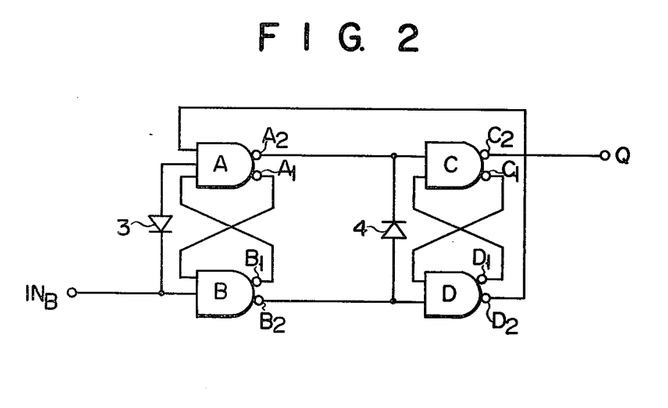
FIG. 2 is a schematic circuit diagram of a flip-flop circuit according to the invention, having the same function as of the FIG. 1 circuit.
Figure 8:
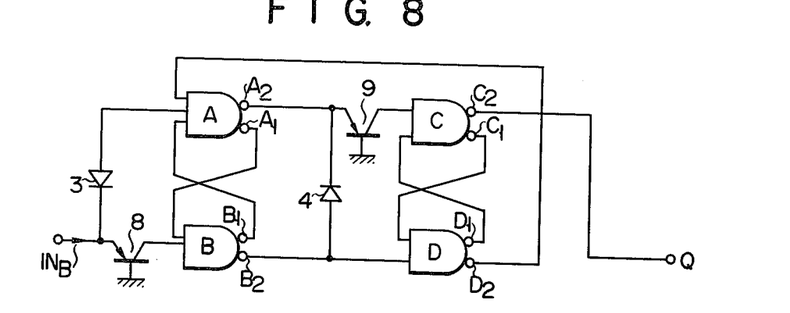
FIG. 8 is a circuit diagram of a second embodiment of the flip-flop circuit according to the invention.

FIG. 8 shows a modification of the FIG. 2 circuit. In the modification, a transistor 8 is inserted between the input terminal of the gate B and the cathode of a diode 3 and a transistor 9 between the input terminal of the gate C and the cathode of the diode 4. These transistors 8 and 9 are delay transistors for preventing erroneous operation of the FF circuit by intentionally elongating the rising time of the current fed to the input terminal of the gates C and B. The FF circuit shown in FIG. 8 integrated by using IIL is illustrated in plan view in FIG. 9. The equivalent circuit of the FIG. 9 is shown in FIG. 10.

Figure 9:
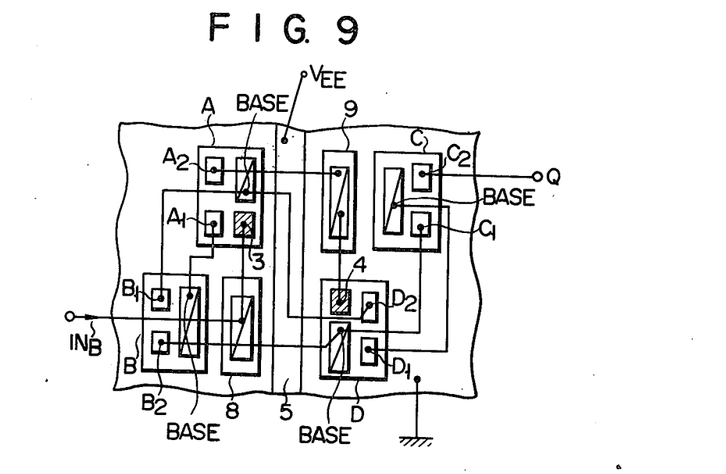
FIG. 9 is a plan view of the flip-flop circuit of FIG. 8 when it is fabricated by the integrated circuit.
Figure 10:
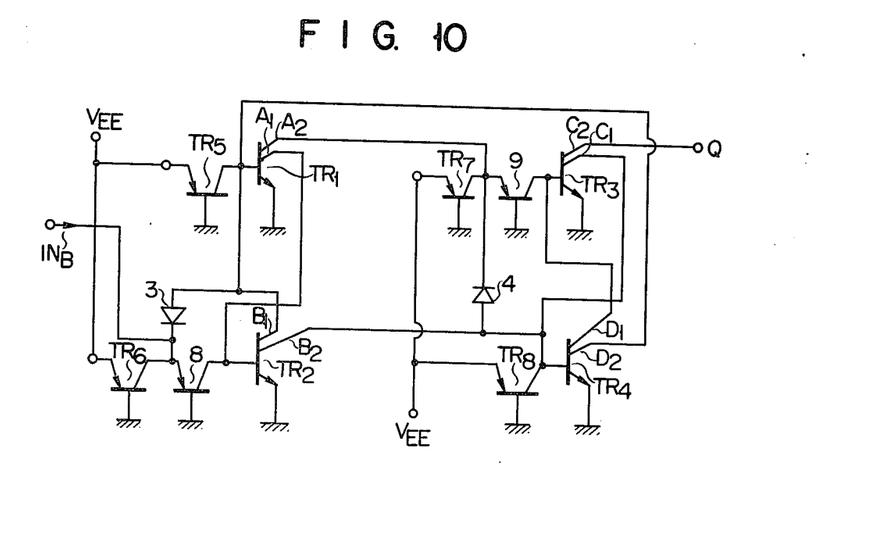
FIG. 10 is a circuit diagram corresponding to the structure shown in FIG. 9.

The explanation of FIGS. 10 and 9 will be omitted by attaching like symbols in FIG. 3 to the corresponding portions in FIG. 10 and like symbols in FIG. 9 to the corresponding portions in FIG. 10.

Figure 11:
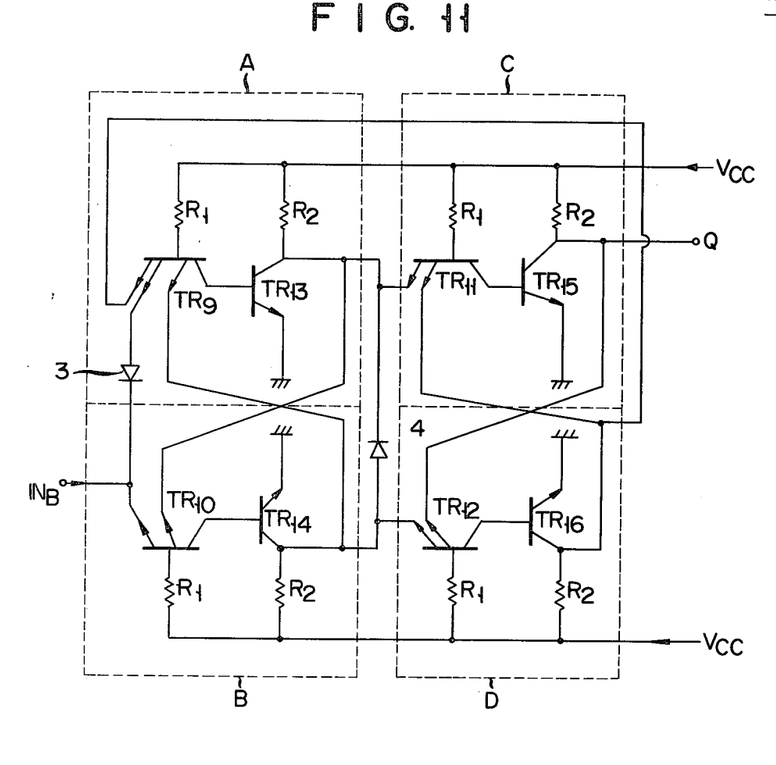
FIG. 11 is a third embodiment of the invention, being constructed by TTL (transistor-transistor logic)

The present invention is not limited to the FF circuit using IIL, in application, but is applicable for FF circuits using TTL (transistor-transistor logic). FIG. 11 shows a third embodiment of the FF circuit using TTL. All of the transistors $TR_9$ to $TR_{12}$ constituting the TTL FF circuit are of the type with multiple inputs and a single output type. A logical gate A is comprised of a transistor $TR_9$, a base input resistor $R_1$, an inverter $TR_{13}$, and a collector resistor $R_2$ of the inverter. Other logical gates B, C, D are constructed by similar components, with omission of the details thereof. A diode 3 is inserted between one of the input terminals of the gate A and one of the input terminals of the gate B, with the polarity as shown. An input signal $IN_B$ is fed to the one input terminal of the gate B. Another diode 4 is inserted between one of the input terminals of the gate C and one of the input terminals of the gate D, with the polarity as shown. A driving source $V_{CC}$ is coupled with the bases of the transistors $TR_9$ to $TR_{12}$ through a resistor $R_1$ and with the collectors of the inverter transistors $TR_{13}$ to $TR_{16}$ through a resistor $R_2$. The output Q is derived from the collector of the inverter transistor $TR_{15}$.

Figure 12:
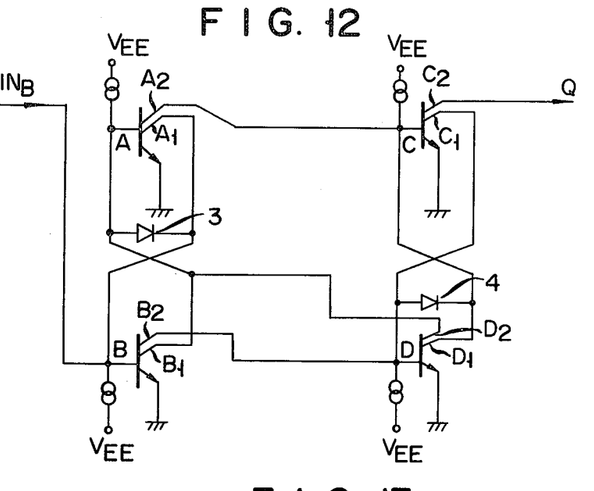
FIG. 12 is a fourth embodiment of the FF circuit of the invention.
Figure 13:
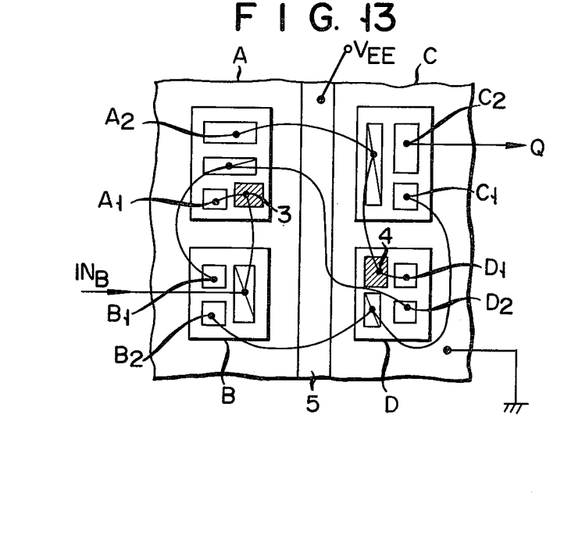
FIG. 13 is a plan view of the FF circuit in FIG. 12 fabricated by the integrated circuit.

A fourth embodiment of the invention will be described with reference to FIGS. 12 and 13. The circuit connnection of the FF circuit of FIG. 12 is the same as of the FIG. 3 circuit, except that the injector transistors are represented by its symbols. Note, however, that, as shown in FIG. 13, the junction areas of the collector regions of the second output terminals $A_2$ and $C_2$ of the gates A and C are larger than those of the first output terminals $A_1$ and $C_1$ thereof. The junction areas of $A_2$ and $C_2$ are larger than those of $A_1$ and $C_1$. In this way, the stability of the operation of the FF circuit is enhanced.

Figure 14:
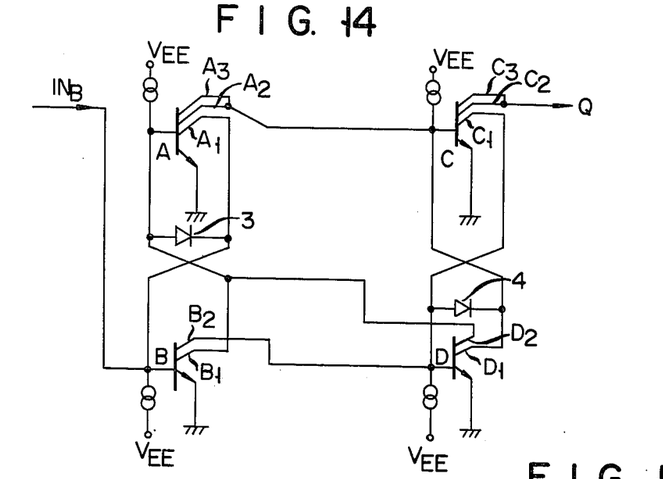
FIG. 14 is a circuit diagram of a fifth embodiment of the FF circuit of the present invention.
Figure 15:
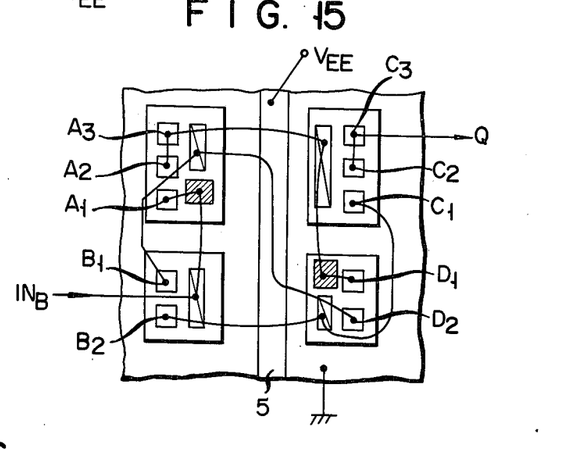
FIG. 15 shows a plan view of the FF circuit shown in FIG. 14 which is fabricated by the integrated circuit.

A fifth embodiment of the FF circuit is shown in FIGS. 14 and 15. In the embodiment, the collector regions of the output terminals $A_1$ and $A_2$ are equal in area to each other. Further, the collector regions of the output terminals $C_1$ and $C_2$ are also equal in area to each other. Junction areas for all output terminals are equal. In this example, the gates A and C are provided with third output terminals $A_3$ and $C_3$. The output terminals $A_2$ and $A_3$ are connected to each other and the output terminals $C_2$ and $C_3$ also are connected commonly. In FIGS. 13 to 15, the slanted portions of the base regions of the gates A and D are Shottky diodes made of titanium, for example.

Figure 5:
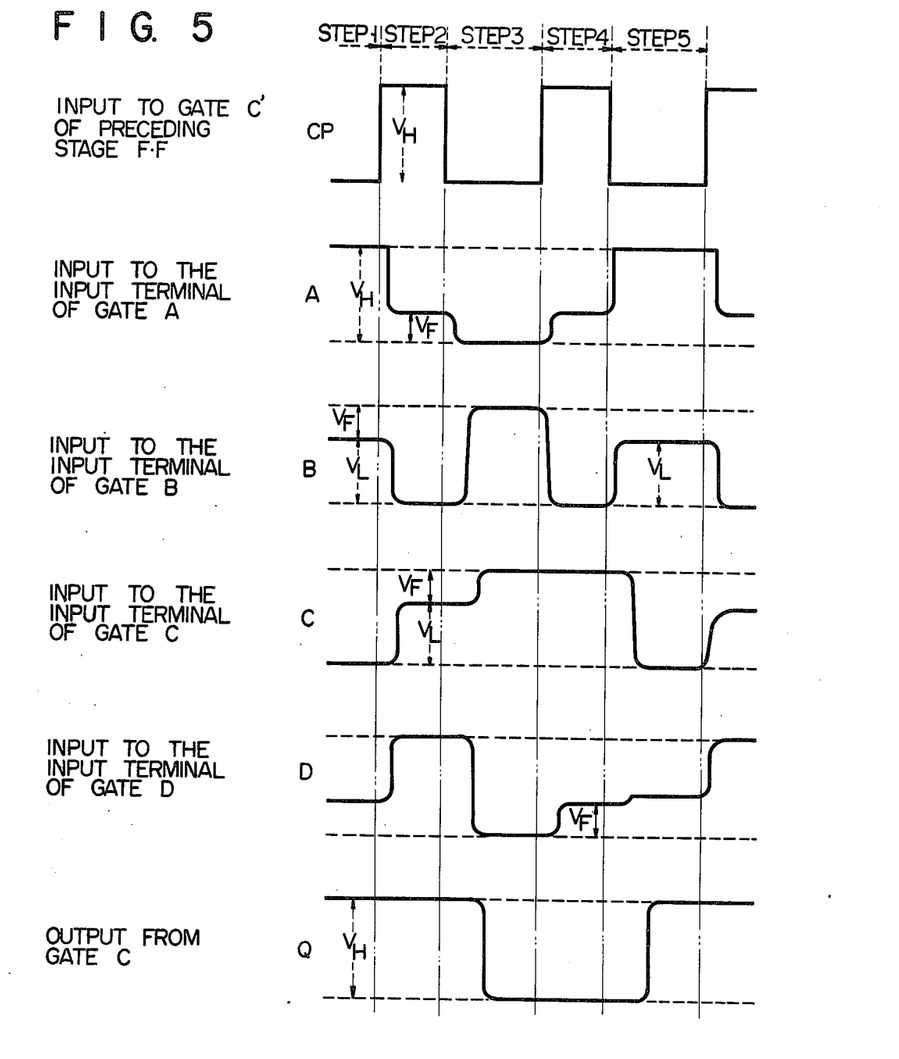
FIG. 5 is a set of waveforms useful in explaining the operation of the FF circuit shown in FIG. 3.
Figure 6:
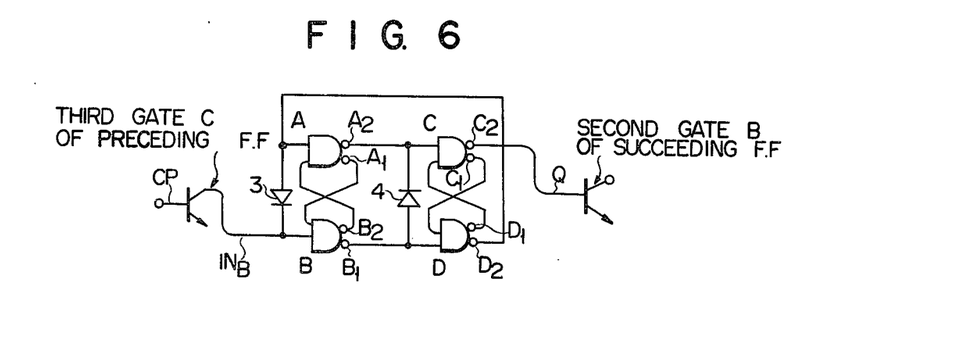
FIG. 6 is schematic diagram for illustrating the relationship with the preceding stage FF circuit for explaining the FIG. 5 waveforms.

The operations of the fourth embodiment shown in FIGS. 12 to 13 and fifth embodiment shown in FIGS. 14 to 15 are just the same as that described referring to FIG. 5 of the first embodiment shown in FIGS. 2 to 4, thus omitting the explanation thereof. In the fourth embodiment shown in FIG. 12, if the junction area of the collector region corresponding to the output terminal $A_2$ of the gate A is made larger than the junction area of the collector region corresponding to the output terminal $A_1$ of the same gate, the levels of the inputs to the gates C and D can be reduced sufficiently when the gate A is in the "ON" state. If the junction area of the collector region corresponding to the output terminal $C_2$ of the gate C is made larger than the junction area of the collector region corresponding to the output terminal $C_1$ of the same gate, the levels of the inputs to gates A' and B' of a succeeding flip-flop circuit are lowered sufficiently when the gate C is in the "ON" state. The circuit arrangement of the succeeding flip-flop circuit is entirely the same as that of FIG. 12, the gates A', B' and gates C', D' (not shown) of the succeeding flip-flop circuit are arranged to correspond to the gates A, B, C, D in FIG. 12 and the output terminal $C_2$ of the gate C is connected to an input terminal of the gate B' of the succeeding flip-flop circuit.

In the fifth embodiment shown in FIG. 14, the second output terminal $A_2$ and the third output terminal $A_3$ of the gate A are connected together and the second output terminal $C_2$ and the third output terminal $C_3$ of the gate C are also connected together. Therefore, the flip-flop circuit shown in FIG. 14 performs the same function as that of the flip-flop circuit shown in FIG. 12. In this way, a precise frequency dividing operation is ensured.

As seen from FIG. 5, the diodes 3 and 4 reduce the logical amplitude of a part of the signal applied to the input terminal of each gate.

Figure 16:
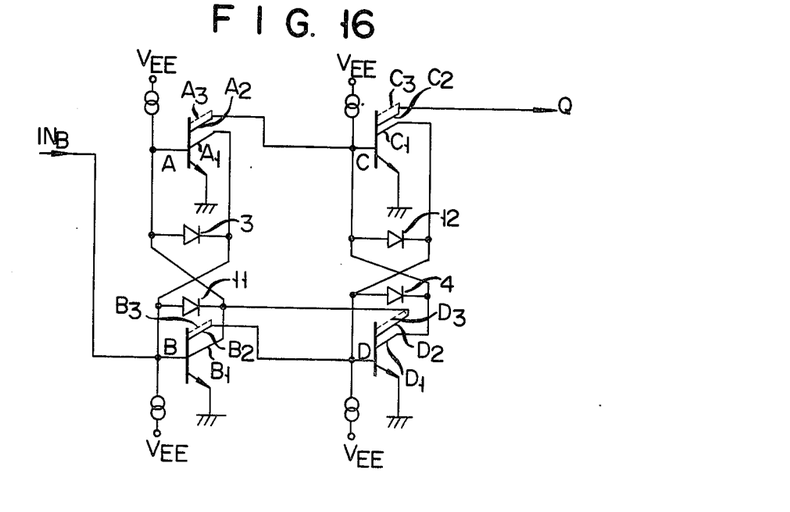
FIG. 16 is a sixth embodiment of the FF circuit according to the invention.
Figure 17:
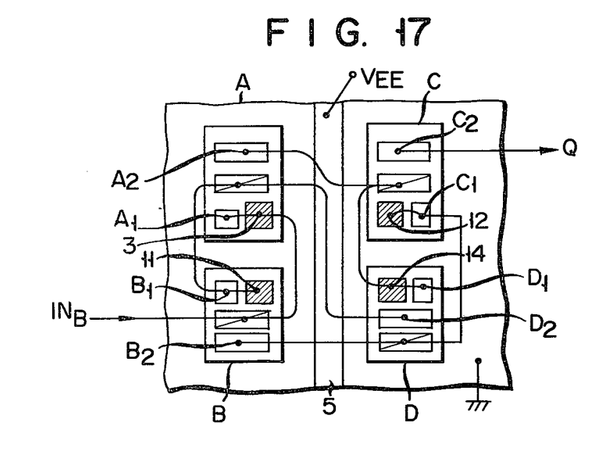
FIG. 17 is a plan view of the integrated FIG. 16 circuit.

In the sixth embodiment shown in FIGS. 16 and 17, the junction areas of the second output terminals $A_2$, $B_2$, $C_2$ and $D_2$ of the gates A, B, C and D are larger than those of first output terminals $A_1$, $B_1$, $C_1$ and $D_1$ thereof, respectively and diodes 11 and 12 are further provided. The diode 11 is forwardly connected from the input terminal of the gate B to the first output terminal $B_1$ thereof. The diode 12 is forwardly connected from the input terminal of the gate C to the first output terminal $C_1$ thereof. FIG. 17 shows a plan view of the FF circuit of FIG. 16 integrated.

Figure 18:
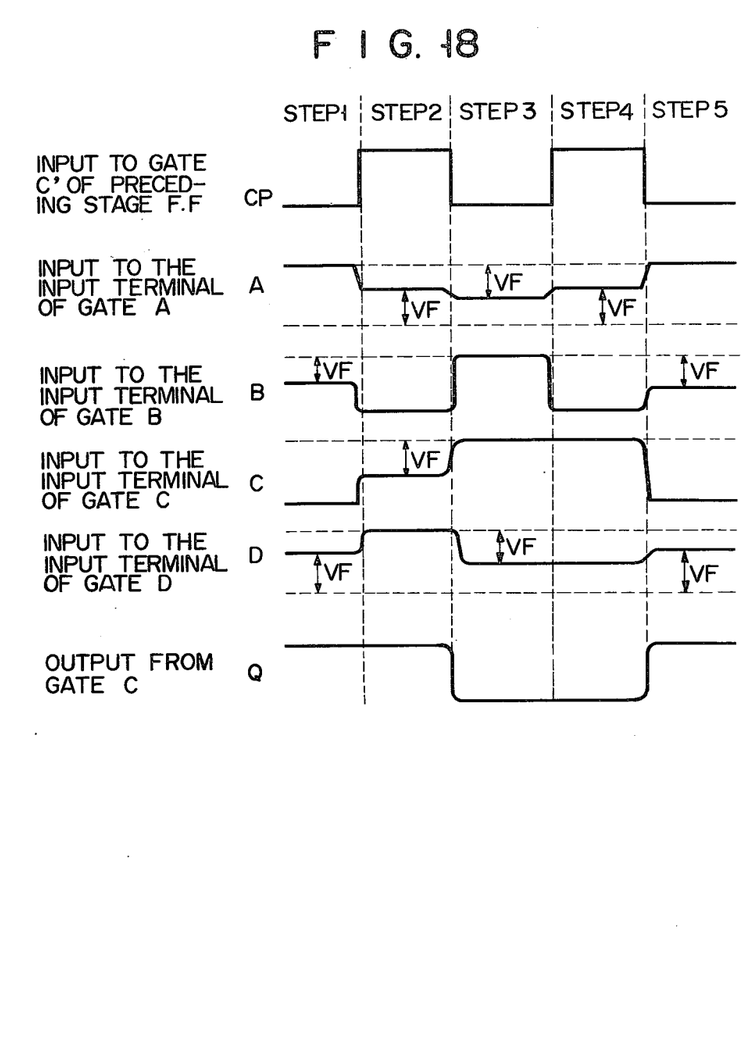
FIG. 18 is a set of waveforms for illustrating the operation of the FF circuit shown in FIG. 16.

The operation of the example shown in FIGS. 16 and 17 is much the that of the FIG. 5 circuit. FIG. 18 is depicted with an assumption that the respective signal waveforms have no time delay. Comparing with FIG. 5, the input logical amplitude at the step 3 of the each gate A and D is smaller by the forward voltage drop of gate 11 or 12.

In this sample, third output terminals $A_3$ and $C_3$ may be additionally provided to the gates A and C, respectively and be connected to the output terminals $A_2$ and $C_2$, respectively. Further, the gates B and D may be provided with additional third output terminals $B_3$ and $D_3$ and these output terminals may be connected to the output terminals $B_2$ and $D_2$, respectively. Such a connection is effective for a stable operation of the flip-flop circuit when the junction areas of the collector regions corresponding to the output terminals $A_2$, $B_2$, $C_2$ and $D_2$ are equal to the respective junction areas of the collector regions corresponding to the output terminals $A_1$, $B_1$, $C_1$ and $D_1$.

What is claim is:

1. In a flip-flop circuit including at least first and second gates, each logical gate having at least two inputs and at least one output, an output of said first logical gate being coupled as one input of said second logical gate, and an output of said second logical gate being coupled as one input of said first logical gate, the improvement comprising a diode connected between another input of said first logical gate and another input of said second logical gate to permit only unidirectional current flow between said another inputs of said first and second logic gates.

2. A flip-flop circuit including first, second, third and fourth NAND gates, each NAND gate having at least one input terminal and at least two output terminals, and in which: a first diode is connected forwardly from the input terminal of the first NAND gate to the input terminal of the second NAND gate, and a second diode is connected forwardly from the input terminal of the fourth NAND gate to the input terminal of the third NAND gate; the first output terminal of the first NAND gate is connected to the input terminal of the second NAND gate, the first output terminal of the second NAND gate is connected to the input terminal of the first NAND gate, and the second output terminal of the fourth NAND gate is connected to the input terminal of the first NAND gate; the second output terminal of the first NAND gate is connected to the input terminal of the third NAND gate, the second output terminal of the second NAND gate is connected to the input terminal of the fourth NAND gate, the first output terminal of the third NAND gate is connected to the input terminal of the fourth NAND gate, and the first output terminal of the fourth NAND gate is connected to the input terminal of the third NAND gate; and the input terminal of the second NAND gate comprising an input signal receiving means and the second output terminal of the third NAND gate comprising an output of said flip-flop circuit.

3. A flip-flop circuit having first, second, third and fourth logical gates, each gate being an integrated injection logic circuit and each gate having at least one input terminal and at least two output terminals, and, in which: the first output terminal of the first logical gate is connected to the input terminal of the second logical gate, and the second output terminal of the first logical gate is connected to the input terminal of the third logical gate; the first output terminal of the second logical gate is connected to the input terminal of the first logical gate and to the second output terminal of the fourth logical gate, and the second output terminal of the second logical gate is connected to the input terminal of the fourth logical gate; the first output terminal of the third logical gate is connected to the input of the fourth logical gate; the first output terminal of the fourth logical gate is connected to the input terminal of the third logical gate; a first diode is connected forwardly from the input terminal of the first logical gate to the input terminal of the second logical gate; a second diode is connected forwardly from the input terminal of the fourth logical gate to the input terminal of the third logical gate; and the input terminal of the second logical gate comprising an input signal receiving means and the second output terminal of the third logical gate comprising an output of said flip-flop circuit.

4. A flip-flop circuit according to claim 3, in which the first logical gate has a junction area for the collector region of the second output terminal thereof which is larger than that for the collector region of the first output terminal thereof; and the third logical gate has a junction area for the collector region of the second output terminal thereof which is larger than that for the collector region of the first output terminal thereof.

5. A flip-flop circuit according to claim 3, in which said first logical gate includes a third output terminal connected to said second output terminal; and said third logical gate includes a third output terminal connected to said second output terminal.

6. A flip-flop circuit according to claim 3, comprising a third diode connected forwardly from the input terminal of the second logical gate to the first output terminal thereof; and a fourth diode connected fowardly from the input terminal of the third logical gate to the first output terminal thereof.

7. A flip-flop circuit according to claim 6, in which the second logical gate has a junction area for the collector region of the second output terminal thereof which is larger than that for the collector region of the first output terminal thereof; and the fourth logical gate has a junction area for the collector region of the second output terminal thereof which is larger than that for the collector region of the first output terminal thereof.

8. A flip-flop circuit according to claim 6, in which said second logical gate includes a third output terminal connected to the second output terminal thereof and said fourth logical gate includes a third output terminal connected to the second output terminal thereof.

* * * * *